United States Patent [19]
Demirlioglu et al.

[11] Patent Number: 5,893,742
[45] Date of Patent: Apr. 13, 1999

[54] CO-IMPLANTATION OF ARSENIC AND PHOSPHORUS IN EXTENDED DRAIN REGION FOR IMPROVED PERFORMANCE OF HIGH VOLTAGE NMOS DEVICE

[75] Inventors: Esin Kutlu Demirlioglu, Cary, N.C.; Monir H. El-Diwany, Saratoga, Calif.

[73] Assignee: National Semiconductor Corporation, Santa Clara, Calif.

[21] Appl. No.: 08/724,293

[22] Filed: Sep. 19, 1996

Related U.S. Application Data

[63] Continuation of application No. 08/373,144, Jan. 17, 1995, abandoned.

[51] Int. Cl.$^6$ .................................................. H01L 21/336
[52] U.S. Cl. ............................................. 438/307; 438/529
[58] Field of Search .................................. 438/306, 307, 438/526, 529, 546

[56] References Cited

U.S. PATENT DOCUMENTS

| | | | |
|---|---|---|---|
| 4,697,333 | 10/1987 | Nakahara | 437/44 |
| 4,795,716 | 1/1989 | Yilmaz et al. | 437/29 |
| 4,859,620 | 8/1989 | Wei et al. | 437/44 |
| 4,928,163 | 5/1990 | Yoshida et al. | 257/344 |
| 4,935,379 | 6/1990 | Toyoshima | 437/44 |
| 5,024,960 | 6/1991 | Haken | 437/44 |

FOREIGN PATENT DOCUMENTS

| | | |
|---|---|---|
| 0059848 A3 | 9/1982 | European Pat. Off. . |
| 0187016 A3 | 7/1986 | European Pat. Off. . |
| 4112072 A1 | 10/1991 | Germany . |
| 2277406 | 10/1994 | United Kingdom . |

OTHER PUBLICATIONS

Eiji Takeda, "An AS–P($n^+$–$n^-$) Double Diffused Drain MOSFET for VLSI's," IEEE Transactions on Electron Devices, vol. ED–30, No. 6, Jun. 19, 1983 IEEE.

Y. Toyoshima et al., "Profiled Lightly Doped Drain (PLDD) Structure for High Reliable NMOS–FETs," Semiconductor Device Engineering Laboratory Toshiba Corporation. (No Date).

Hsia et al., "Polysilicon Oxidation Self–Aligned MOS (POSA MOS)—A New Self–Aligned Double Source/Drain Ion Implantation Technique for VLSI", IEEE Electron Device Letters, vol. EDL–3, No. 2, Feb. 1982, New York, USA, pp. 40–42.

Yoshikawa et al., "A Reliable Profiled Lightly Doped Drain (PLD) Cell for High–Density Submicrometer EPROM's and Flash EEPROM's", IEEE Transactions on Electron Devices, vol. 37, No. 2, Apr. 1990, New York, USA, pp. 999–1006.

*Primary Examiner*—Chandra Chaudhari
*Attorney, Agent, or Firm*—Skjerven, Morrill, MacPherson, Franklin & Friel LLP; Edward C. Kwok

[57] ABSTRACT

A high voltage NMOS device includes an extended drain region formed by implantation of arsenic and phosphorus and a drivein of both the species. The dosage of arsenic is substantially higher than the dosage of phosphorus, so that upon drivein, the slower diffusing arsenic is highly concentrated near the surface of the extended drain region, while the more rapidly diffusing phosphorus provides a gradual gradient of concentration of dopant into the extended drain region.

15 Claims, 8 Drawing Sheets

CO-IMPLANTATION OF ARSENIC AND PHOSPHORUS IN EXTENDED DRAIN REGION FOR IMPROVED PERFORMANCE OF HIGH VOLTAGE NMOS DEVICE

This application is a continuation of application Ser. No. 08/373,144, filed Jan. 17, 1995, now abandoned.

FIELD OF THE INVENTION

This invention relates to a high voltage device having an extended drain region, and more particularly, to such a device which includes formation of the extended drain region by means of co-implantation of different ion species.

BACKGROUND OF THE INVENTION

A typical high voltage NMOS device 10 (FIG. 1), normally one of a large grid of cells, includes a P– substrate 12 having an N– epitaxial layer 14 thereover, the substrate 12 and epitaxial layer 14 together making up the body 16 of the device 10. An N+ buried layer 18 is shown at the junction of the epitaxial layer 14 and substrate 12. A boron P– well 20 (the "Pwell") is formed in the epitaxial layer 14, and formed in the Pwell 20 are the N type source 22 and drain 24 of the device 10. The drain 24 is made up of a heavily doped main region 26 and a lightly doped extended region 28. Doping of the source 22 and drain 24 may be by, for example, arsenic or phosphorus. A gate oxide 30 and a gate 32 are included, and contacts 34, 36 reach to the source 22 and drain 24 respectively, through a dielectric layer such as oxide layer 38.

Several failure mechanisms which are competitive in nature limit the maximum operating voltage of the device 10. These mechanisms can be summarized as follows:

1. The intrinsic breakdown voltage of the drain/Pwell junction is determined by the dopant concentrations on each side of the junction, and their gradients. The lower the dopant concentration on each side and the more gradual the increase in concentration away from the junction, the higher the breakdown voltage of the device. However, lower dopant concentration on the drain side (especially the extended region 28) increases the ON-resistance of the device. Lower dopant concentration on the Pwell side, on the other hand, may cause premature punchthrough of the parasitic vertical NPN bipolar transistor made up of drain 24, Pwell 20, and the epitaxial layer 14 and buried layer 18 N regions. This intrinsic breakdown voltage may undesirably be further lowered due to high electric fields at the curved regions of the junctions or at the oxide/silicon surface.

2. High electric fields at the surface 40 of the body 16 may rupture the oxide 30 at the drain edge. The magnitude of the electric field at the surface 40 is a function of the length of the extended drain region 28 (indicated at X) as well as the dopant concentration in that region. Lower dopant concentration and longer extension length insure a lower surface field but at the expense of larger device size and higher on-resistance.

3. At higher voltages, the drain/Pwell depletion region further extends into the Pwell 20 causing parasitic vertical NPN bipolar device punchthrough. High Pwell concentration increases the punchthrough voltage, but with the breakdown voltage of the device being lowered.

Alternatively, the device can be built on a buried layer 18 that is the same conductivity as the substrate 12 (for example P+ in FIG. 1) so that the problem of punchthrough is avoided, but with the breakdown problem remaining.

FIGS. 2–6 illustrate the process steps for fabricating the device of FIG. 1. With reference to FIG. 2, the device as thus far fabricated includes a P– type semiconductor substrate 50 with an N– epitaxial layer 52 formed thereover, the substrate 50 and epitaxial layer 52 together making up the body 54 of the device. An N+ buried layer 56 is formed at the junction of the epitaxial layer 52 and substrate 50. A P– well 58 ("Pwell") is formed in the epitaxial layer 52 by implantation and drivein of boron, the Pwell 58 extending to the surface of the epitaxial layer 52. A thin layer of oxide 60 is formed over the surface of the epitaxial layer 52, extending to field oxide regions 62. A polysilicon gate 64 is formed over the oxide.

At this point (FIG. 2) a low dosage of phosphorus 66 is implanted through the thin oxide layer 60 into a Pwell 58 in epitaxial layer 52, the gate 64 and oxide regions 62 forming a mask for such implantation. Subsequent thermal processing causes the phosphorus 66 to diffuse into the Pwell 58, forming the regions 68, 70 shown in FIG. 3. Then, a layer of oxide 72 is deposited on the resulting structure (FIG. 4). An anisotropic etch is undertaken to define oxide spacers 74 (FIG. 5).

Photoresist 76 is then applied and patterned as shown in FIG. 5, and a high dosage of phosphorus 78 is implanted as shown. After removal of the photoresist 76, diffusion of the phosphorus 78 is undertaken to form the device of FIG. 6, including source 80 and drain 82, which drain 82 includes heavily doped region 84. As shown therein, the dimension X indicates the length of the lightly doped extended drain region 86, extending from the heavily doped main drain region 84 toward the source 80, so that channel region 88 is defined between the source 80 and the extended drain region 86.

As an alternative, a like process flow incorporating arsenic in place of phosphorus to form the source and drain is also commonly used. Completion of the process results in the device of FIG. 1.

Doping profiles in the drain/Pwell region as indicated at section I—I of FIG. 6 are illustrated in FIG. 7, for phosphorus implanted at 7E12 cm$^{-2}$ at 60 KeV to form the extended drain region or arsenic implanted at 7E12 cm$^{-2}$ at 120 KeV to form the extended drain region, with different thermal cycles to yield approximately the same or similar junction depths. Corresponding one-dimensional intrinsic breakdown voltages of these Pwell-extended drain region junctions are 29.3 volts and 28.9 volts for phosphorus and arsenic process flows respectively. However, measurements of these devices indicate failure at 23 volts due to punchthrough.

Increasing the Pwell boron dose and/or drivein time will result in a higher punchthrough voltage in each (i.e., phosphorus or arsenic type) device. FIG. 8 illustrates simulated punchthrough/breakdown voltage tradeoffs as a function of Pwell drive time for three different Pwell doses (7E12 cm$^{-2}$, 6E12 cm$^{-2}$, and 5E12 cm$^{-2}$, all at 80 KeV), with drivein undertaken at 1100° C.

For a specific application, a breakdown voltage higher than 25 volts and a punchthrough voltage higher than 30 volts are required. With reference to FIG. 8, a 5E12 cm$^{-2}$ Pwell dose is shown to be inadequate, regardless of the Pwell drive time, to meet the punchthrough voltage requirement, although a high breakdown voltage would be provided. As the Pwell dose is increased to 6E12 cm$^{-2}$, especially with increased Pwell drive time, the device seems to meet both the breakdown and punchthrough specifications. These numbers, however, represent one-dimensional simulation results under nominal processing conditions.

3

Two-dimensional breakdown mechanisms, as well as process variations, easily lower either the breakdown or punchthrough voltage. Increasing the Pwell dose to 7E12 cm$^{-2}$ to increase the punchthrough voltage, however, reduces the breakdown voltage as indicated in FIG. 8.

As an alternative, all conductivities of the device can be reversed, with the same analysis applying.

Reference is made to "An As-P(n$^+$-n$^-$) Double Diffused Drain MOSFET for VLSI's," by Eiji Takeda, IEEE Transactions On Electron Devices, Vol. ED-30, No. 6, Jun. 19, 1983 IEEE, which discusses a double diffused drain MOSFET device. In such a device, phosphorus is implanted into the mask device body and diffused thereinto, and subsequently, using the same mask, arsenic is implanted into the body to combine with phosphorus to form the source and drain of the device. However, it will be noted that this document is not concerned with high voltage devices or with extended drain regions and drain series resistance is not a primary factor.

The article "Profiled Lightly Doped Drain (PLDD) Structure for High Reliable NMOS-FETs," by Y. Toyoshima et al., Semiconductor Device Engineering Laboratory TOSHIBA Corporation, discusses formation of a profiled lightly doped drain of an NMOS device. Both arsenic and phosphorus are used to form the profiled portion of the drain region. However, again, this document is not concerned with a high voltage device, nor is an extended drain region formed of the type utilized in a high voltage device. Both articles are concerned with improving the reliability of low-voltage NMOS.

SUMMARY OF THE INVENTION

The present invention relates to both device and method wherein a high voltage NMOS device includes an extended drain region which contains both phosphorus and arsenic as dopant species. The process flow is such that the extended drain region receives a higher dosage of arsenic than phosphorus, but with the phosphorus diffusing faster than the arsenic to form a graded profile such that the concentration of arsenic is greatest at the surface, while the phosphorus provides a more graded doping in the direction of the Pwell.

BRIEF DESCRIPTION OF THE DRAWINGS

Reference is made to the drawings, in which.

DESCRIPTION OF THE PREFERRED EMBODIMENT

Figure 1:
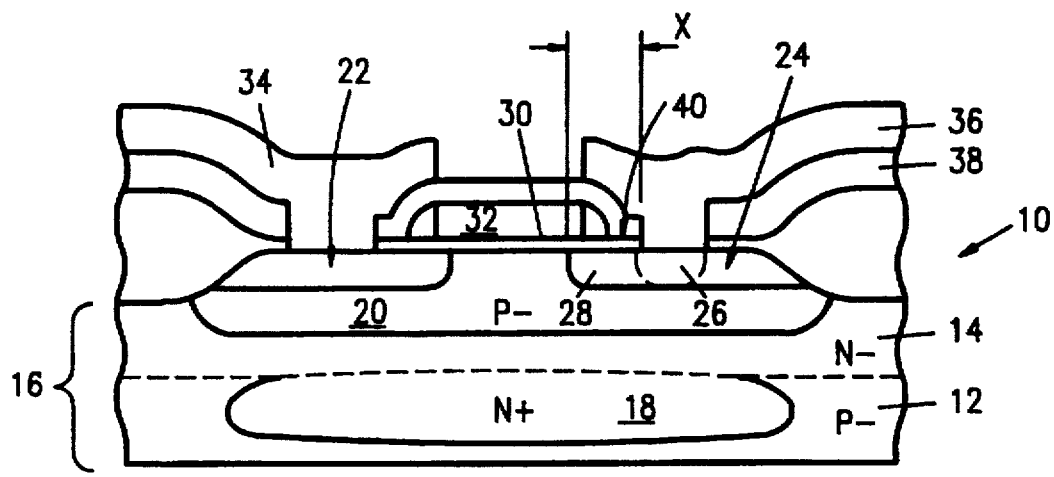
FIG. 1 is a sectional view of a prior art embodiment of an extended drain region high voltage NMOS device.
Figure 2:
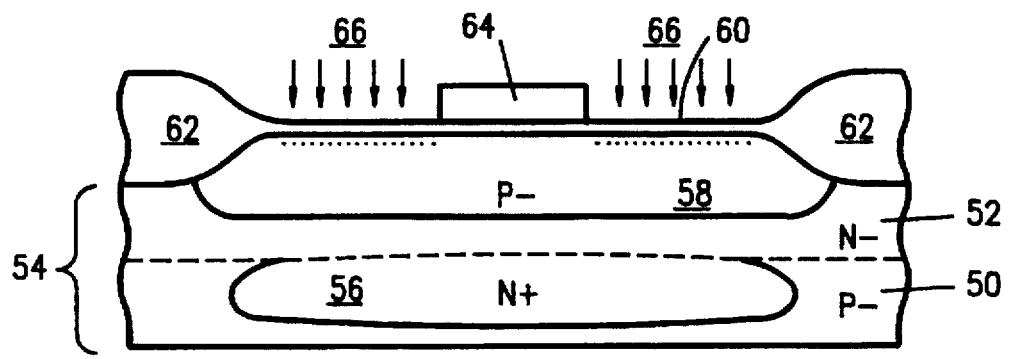
FIGS. 2-6 are a series of cross-sectional views showing method steps for forming the prior art device of FIG. 1.
Figure 3:
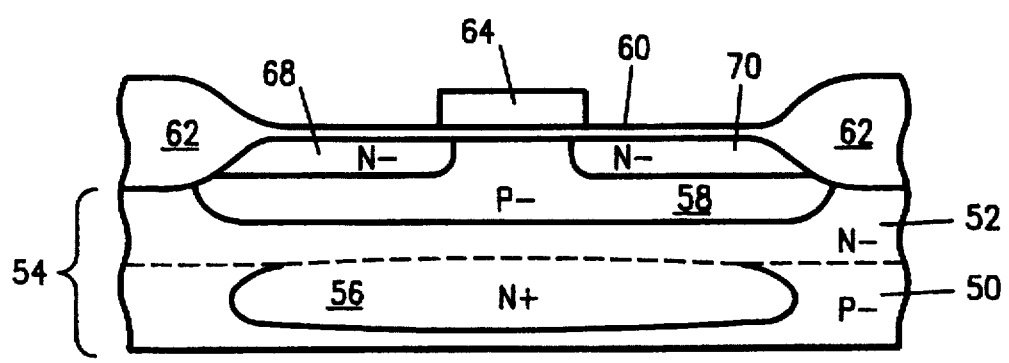
Figure 4:
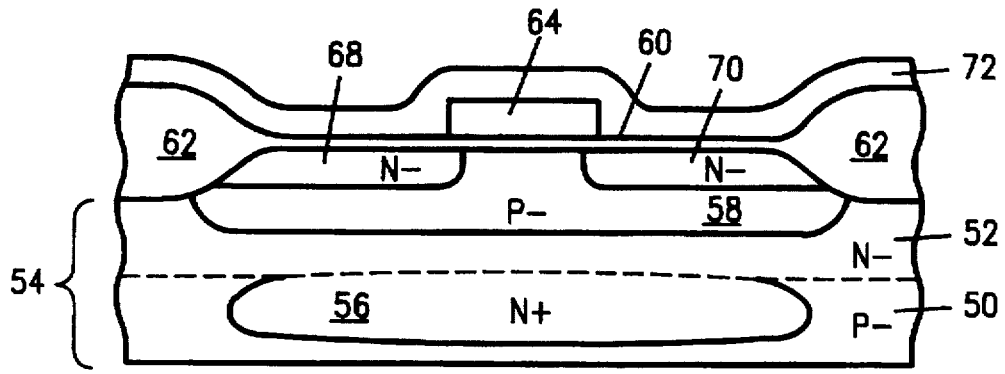
Figure 5:
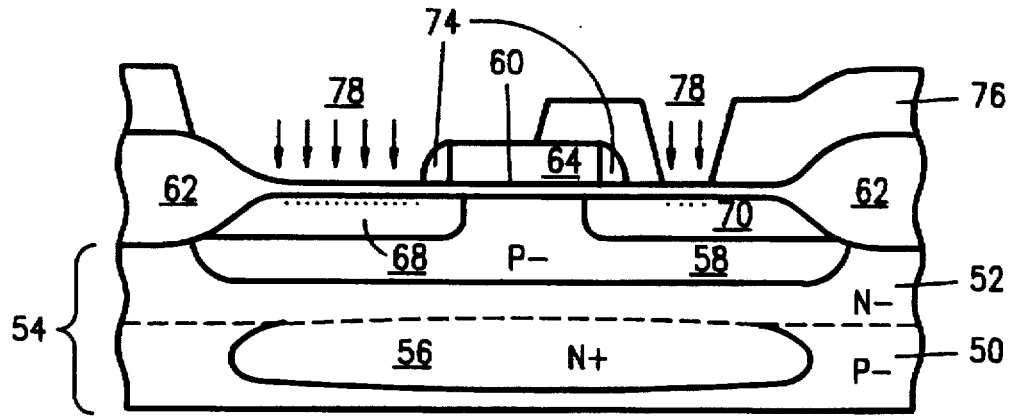
Figure 6:
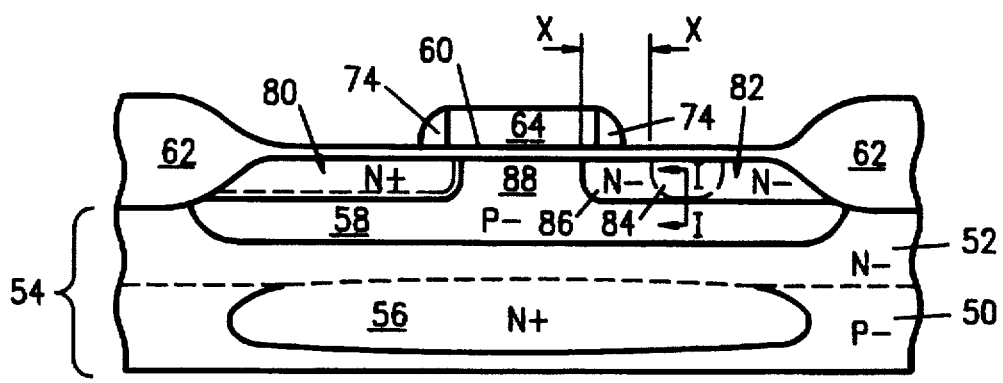
Figure 7:
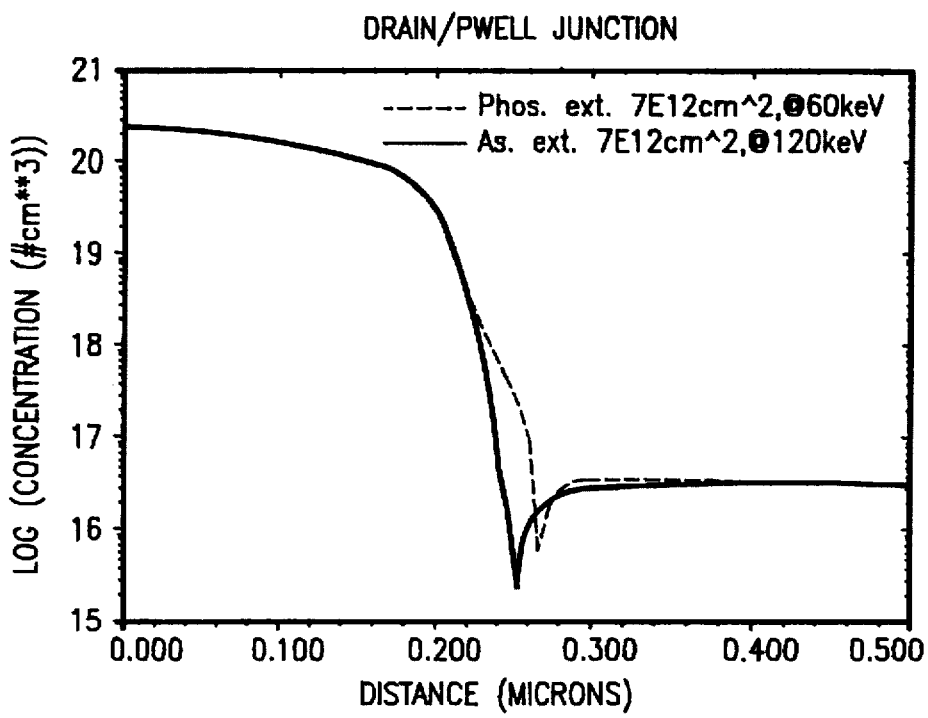
FIG. 7 is a graph showing doping profile of the drain/ Pwell junction of a typical prior art device.
Figure 8:
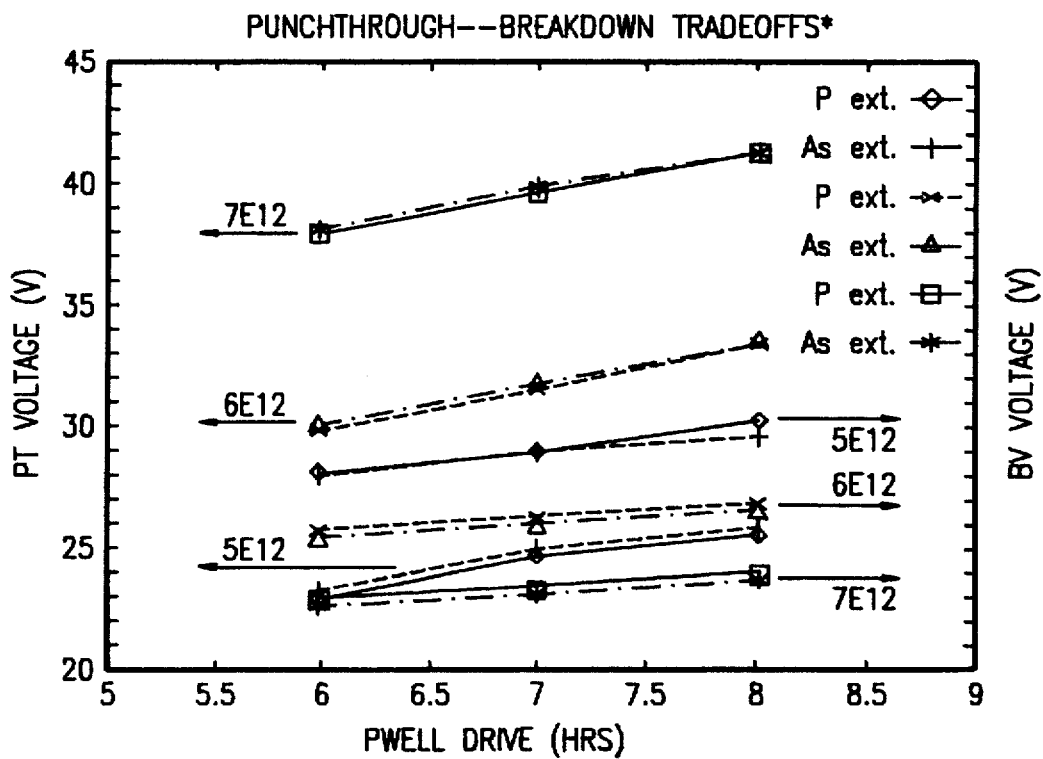
FIG. 8 is a graph showing punchthrough/breakdown voltage tradeoffs of extended drain high voltage NMOS devices of the prior art.
Figure 9:
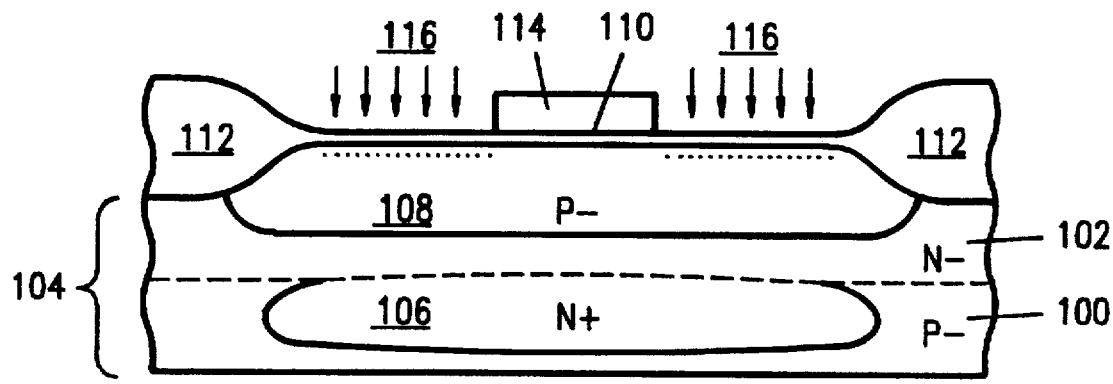
FIGS. 9-14 are a series of cross-sectional views showing method steps by forming the present inventive device.

With reference to FIG. 9, the device as thus far fabricated includes a P– type semiconductor substrate 100 with an N– epitaxial layer 102 formed thereover, the substrate 100 and epitaxial layer 102 together making up the body 104 of the device. An N+ buried layer 106 is formed at the junction of the epitaxial layer 102 and substrate 100. A P– well 108 ("Pwell") is formed in the epitaxial layer 102 by implantation and drivein of boron, the Pwell 108 extending to the surface of the epitaxial layer 102. A thin layer of oxide 110 is formed over the surface of the epitaxial layer 102, extending to field oxide regions 112. A polysilicon gate 114 is formed over the oxide 102.

Figure 10:
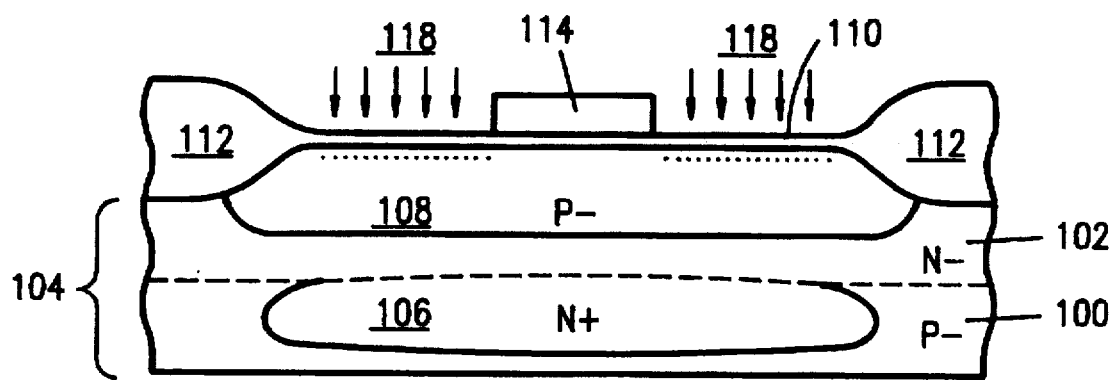
Figure 11:
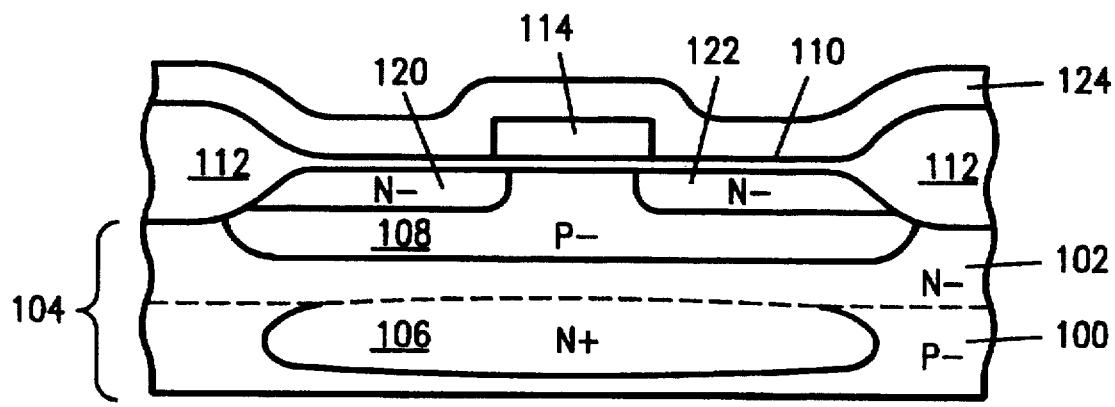

Arsenic 116 is implanted at 5E12 cm$^{-2}$ and 120 KeV through the thin oxide layer 110, the field oxide regions 112 and gate 114 acting as a mask to define the implanted areas of the Pwell 108. Subsequent thereto, a phosphorus implant 118 is undertaken at 2E12 cm$^{-2}$ and 60 KeV (FIG. 10), again using the field oxide regions 112 and gate 114 as a mask to define the implanted areas of the Pwell 108. Subsequently, a thermal cycle of 1100° C. for 20 minutes is undertaken so that the arsenic 116 and phosphorus 118 diffuse into Pwell 108 to form regions 120, 122 profiled as shown in FIG. 11.

Figure 12:
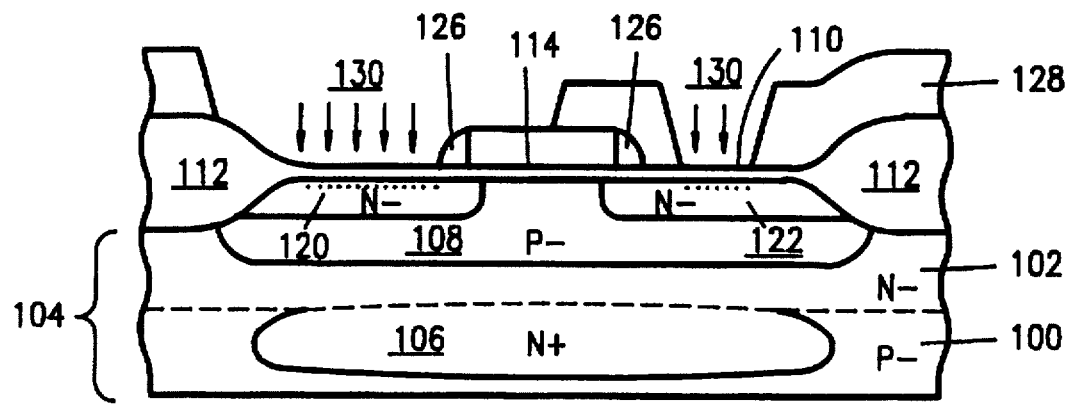

A 0.2 micron thick layer of oxide 124 is deposited over the resulting structure, and is anisotropically etched so that oxide spacers 126 are formed (FIG. 12). Photoresist 128 is patterned as shown in FIG. 12, defining regions into which an implant will be undertaken. Then, a heavy dose of arsenic 130 is implanted at 5×10$^{15}$ cm$^{-2}$ and 80 KeV through the oxide layer 110 into the regions 120, 122.

Figure 13:
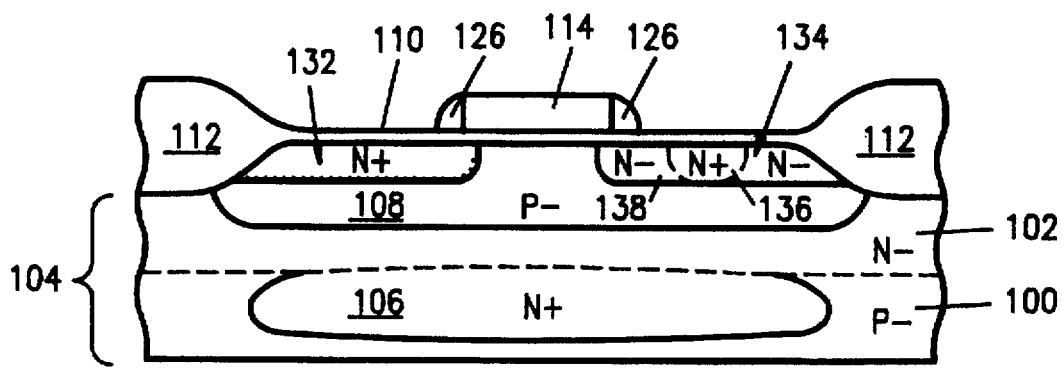

With reference to FIG. 13, a source/drain drive is then undertaken at 950° C. for 30 minutes, so that source 132 and drain 134 take the form as shown in such FIG. 13, the drain 134 being made up of a main drain region 136 which is heavily doped, and an extended drain region 138 which is lightly doped, each of the extended drain region 138 and main drain region 136 containing both phosphorus and arsenic. It will be seen that the source region and drain regions thus far formed are asymmetrical about a vertical line through the gate electrode 114, as is characteristic of high voltage devices.

Finally, a dielectric layer 140 approximately one micron thick is patterned over the resulting structure, and metal interconnects 142, 144 to the source 132 and drain 134 are provided.

Figure 14:
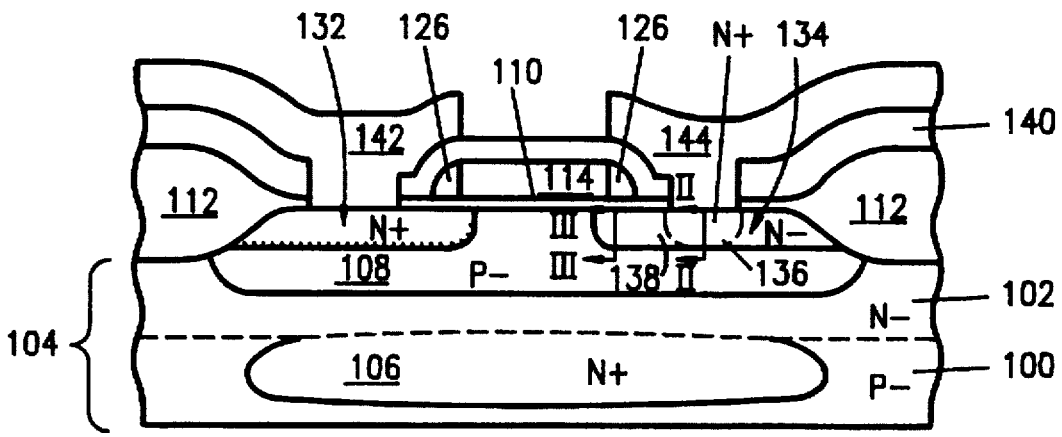
Figure 15A:
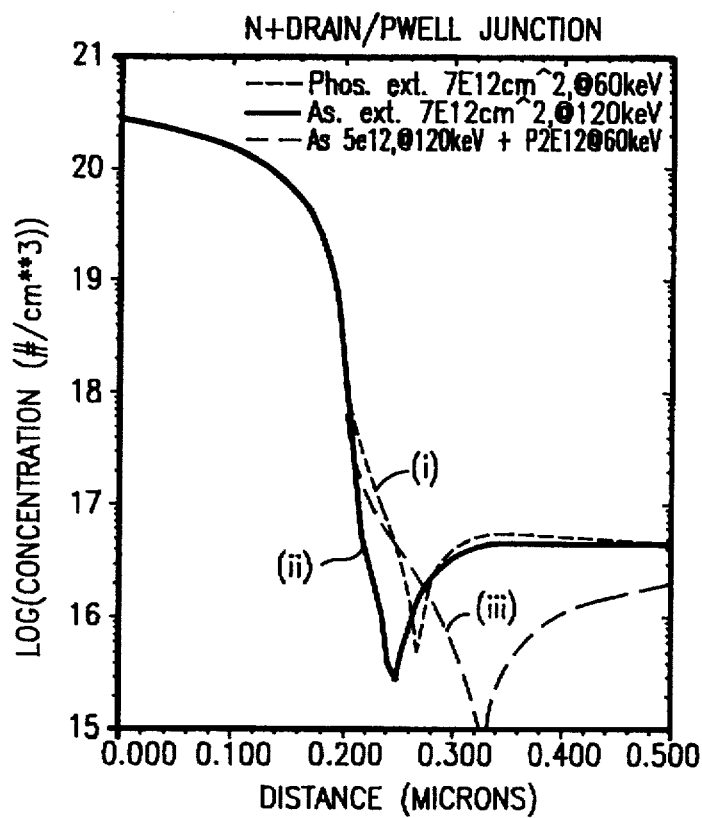
FIGS. 15A and 15B are graphs showing doping profiles of various devices in accordance with the invention compared with doping profiles of prior art devices.

With reference to FIG. 15A, this graph shows doping profiles along a section II—II of FIG. 14, showing the doping profile from the heavily implanted main drain region 136 through the Pwell junction, (i) for a first prior art device using only phosphorus for all source/drain implants, and with the extended drain region being implanted at 7E12 cm$^{-2}$ at 60 KeV, (ii) for a second prior art device using only arsenic for all source/drain implants, with the extended drain region being implanted at 7E12 cm$^{-2}$ at 120 KeV, and (iii) for the present device using both arsenic and phosphorus source/drain implants, with the extended drain region 138 being implanted with arsenic at 5E12 at 120 KeV and phosphorus at 2E12 cm$^{-2}$ at 60 KeV, as described above. As shown in that graph, concentration of dopant is high in all three embodiments at the surface of the device (an advantage for making contact to the device), until the device is measured at approximately 0.2 microns. The present invention doping profile shows a more gradual change in concentration of dopant beyond that distance to the junction, and then a more gradual buildup in concentration of dopant into the Pwell, as compared to the prior art devices.

Figure 15B:
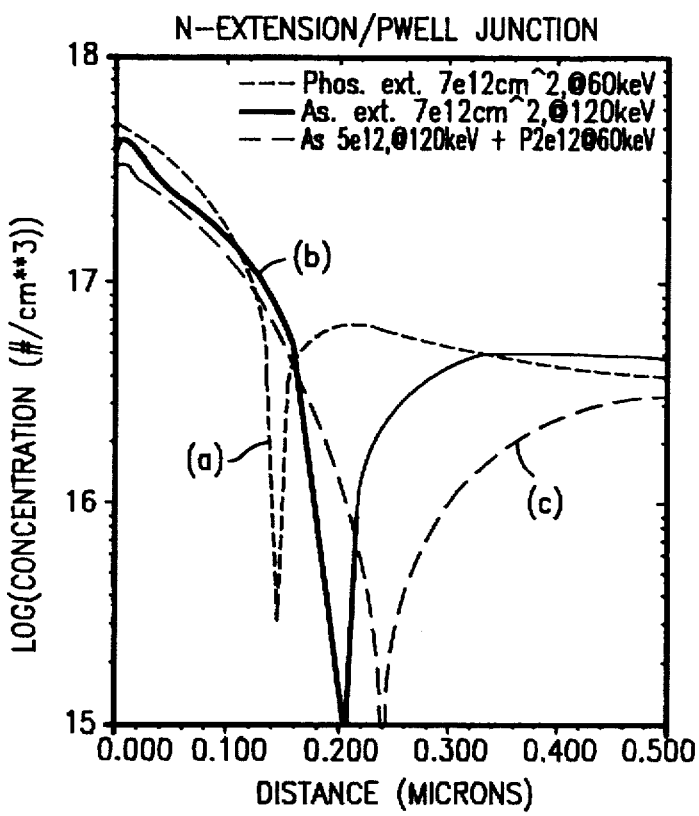

This is also the case with the doping profile of the extended drain region/Pwell junction (section III—III) of each such device, as shown in FIG. 15B. The comparison is made between (a) a prior art device implanted only with phosphorus in the extended drain region at 7E12 cm$^{-2}$ at 60 KeV, (b) a prior art device implanted only with arsenic in the extended drain region at 7E12 cm$^{-2}$ at 120 KeV, and (c) the present device wherein both arsenic and phosphorus are implanted in the extended drain region, the arsenic being implanted at 5E12 cm$^{-2}$ at 120 KeV and the phosphorus being implanted at 2E12 cm$^{-2}$ at 60 KeV, as described above. Again, the doping profile of the present device shows a much more gradual gradient concentration of dopant on both sides of the extended drain region-Pwell junction (FIG. 15B).

Figure 16A:
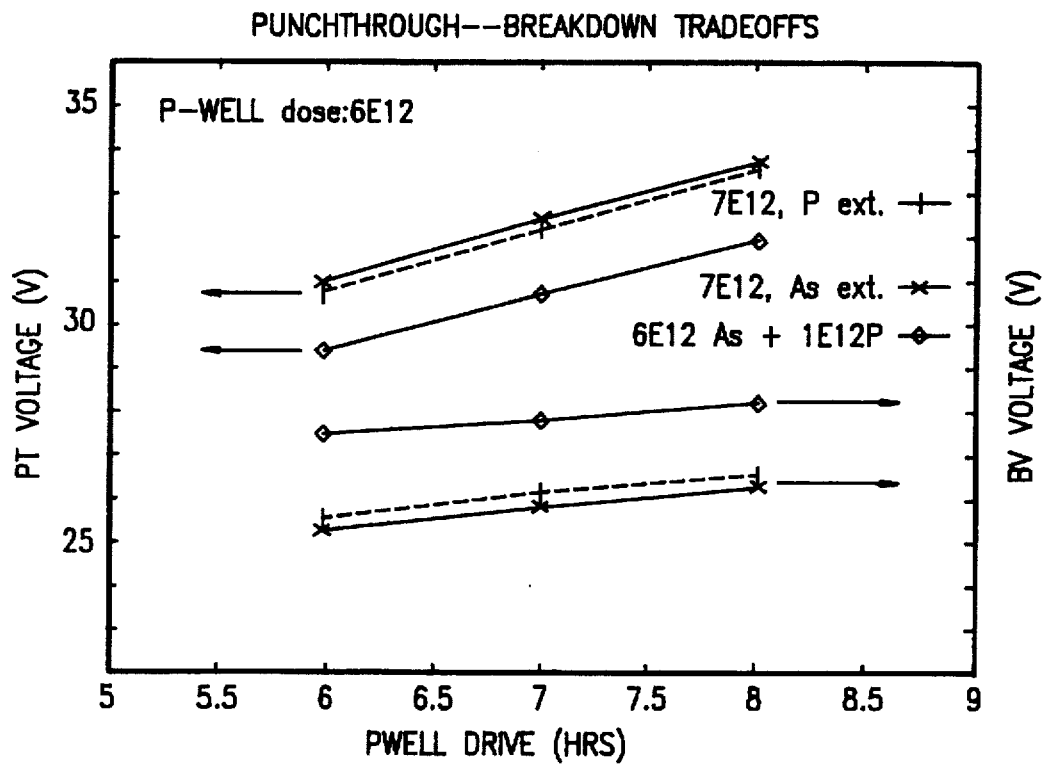
FIGS. 16A and 16B are graphs showing punchthrough/ breakdown voltages tradeoffs of devices in accordance with the invention as compared to such tradeoffs for prior art devices.

FIG. 16A shows punchthrough/breakdown voltage tradeoffs of various prior art and present devices. With reference to FIG. 16A, the comparison is made for devices having Pwells formed by a boron dosage of 6E12 cm$^{-2}$. The extended drain region of prior art devices is formed by phosphorus implant dosage of 7E12 cm$^{-2}$ at 60 KeV, or an arsenic implant dosage of 7E12 cm$^{-2}$ at 120 KeV. The present device extended drain region is formed of an arsenic implant dosage of 6E12 cm$^{-2}$ plus a phosphorus implant dosage of 1E12 cm$^{-2}$, with a subsequent thermal cycle of 1100° C. for 20 minutes to diffuse the arsenic and phosphorus into the Pwell. The graph indicates punchthrough and breakdown voltages for each device as a function of Pwell drive time in hours.

As noted, the target parameters of breakdown voltage of higher than 25 volts and punchthrough voltage of higher than 30 volts can readily be achieved for the present invention.

Figure 16B:
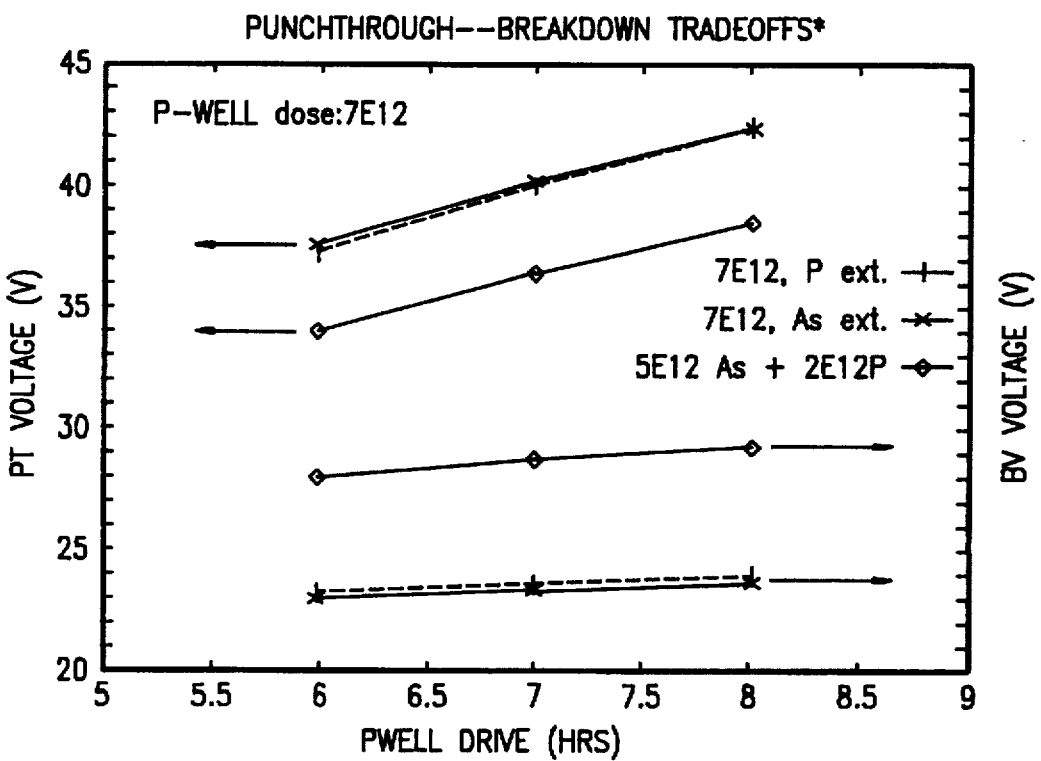

FIG. 16B shows a graph similar to that shown in FIG. 16A, but with a Pwell formed by implant by boron in a dosage of 7E12 cm$^{-2}$, with the present extended drain region dosage of the present invention being 5E12 cm$^{-2}$ arsenic and 2E12 cm$^{-2}$ phosphorus, again with a thermal cycle of 1100° C. for 20 minutes. Again, it will be seen that punchthrough voltage of greater than 30 volts and breakdown voltage of greater than 25 volts can be readily achieved.

With advantage, the phosphorus dosage in the extended drain region may vary from 10% to 40% of the total dosage in that region.

Because the arsenic dosage is much higher than the phosphorus dosage in the extended drain region, with it also being noted that phosphorus diffuses much more quickly than arsenic, the arsenic will be highly concentrated near the surface of the extended drain region, while the phosphorus will diffuse more quickly into the Pwell and provide a better gradient profile than in the prior art.

Such gradient profile increases the breakdown voltage of the device with a slight decrease in punchthrough voltage.

Figure 17:
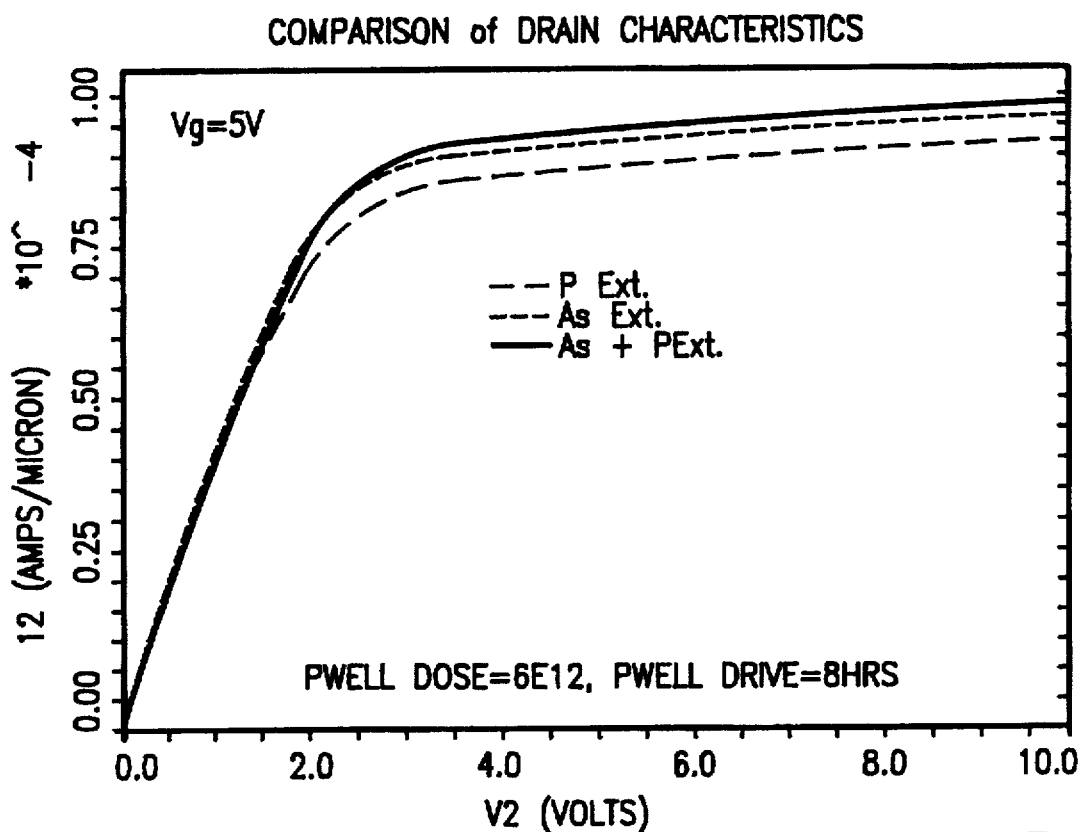
FIG. 17 is a graph showing drain characteristics of a device in accordance with the invention as compared to prior art devices.

With reference to FIG. 17, like drain characteristics of prior art and present devices are compared. All devices have generally the same linear region characteristics, indicating the same on resistance for all such devices.

In other words, the present invention increases punchthrough and breakdown voltages without compromising ON resistance.

In a previous generation of 3 micron process, a prior art transistor of this type typically occupies 60% of the total chip area with an $R_{dson}$ of 0.27 Ωmm$^2$ at $V_{gs}$=10 volts and breakdown voltage of 38 volts. Optimized for the 1.5 micron process, the same architecture was demonstrated with $R_{dson}$ of 0.11 and 0.13 Ωmm$^2$ at $V_{gs}$ equals 10 volts and 5 volts respectively and breakdown voltage of 30 volts. This represents more than a 200% area advantage over the earlier generation technology, but with a lower device breakdown voltage.

We claim:

1. A method of fabricating a high voltage MOS device comprising:

providing a body comprising a semiconductor substrate of a first conductivity having a surface, a buried layer in the substrate underneath the surface, and a well region in the substrate having a second conductivity opposite the first conductivity extending from the surface towards the buried layer;

providing a source region of the first conductivity within the well region adjacent to a surface of the semiconductor substrate;

providing a drain region in the well region adjacent the surface, said drain region being made up of a main drain region and an extended drain region extending to said surface, the main drain region and the extended drain region each being provided two different dopant species both of the first conductivity, so that the extended drain region and source region define a channel region between the source and drain region adjacent the surface;

providing an insulator on the surface over the channel region; and providing a gate over the insulator.

2. The method of claim 1 wherein the step of providing that the extended drain region contains different dopant species comprises implanting first and second dopant species of the same conductivity type in the body, and to diffusing said first then second dopant species into the body.

3. The method of claim 2 and further providing that the first and second dopant species have different diffusion rates.

4. The method of claim 3 and further providing that the dosage of the slower diffusing species is greater than the dosage of the faster diffusing species.

5. The method of claim 3 wherein the first dopant species is arsenic and the second doping species is phosphorus.

6. A method claim 5 and further providing that the extended drain region has a lower dopant concentration than the main drain region.

7. A method of forming a drain of a high voltage MOS device comprising:

providing a body comprising a substrate of a first conductivity having a surface, a buried layer in the substrate underneath the surface and a well region in said substrate of a second conductivity opposite the first conductivity extending from the surface towards the buried layer;

patterning a first masking layer over the body, such that a portion of masking layer is provided on the surface above the well region;

introducing into the well region a first species of dopant ions of the first conductivity, using the portion of the masking layer as a mask;

introducing into the well region a second species of ions of the first conductivity, using the portion of the masking layer as a mask;

patterning a second masking layer over the body, so that a portion of the second layer is provided on the surface; and introducing into the well region additional dopant ions, using both the portion of the first masking layer and the portion of the second masking layer as a mask, thereby defining a heavily doped drain region for the device, and an extended drain region substantially underneath the portion of the second masking layer.

8. The method of claim 7 wherein the first species of dopant ions is introduced into the well region by ion implantation and diffusion.

9. The method of claim 8 wherein the second species of dopant ions is introduced into the well region by ion implantation and diffusion.

10. The method of claim 9 wherein the diffusion of the first and second species takes place simultaneously.

11. The method of claim 10 and further providing that the first and second species have different diffusion rates.

12. The method of claim 11 and further providing that the implant dosage of the slower diffusing species is greater than the implant dosage of the faster diffusing species.

13. The method of claim 12 and further providing that the faster diffusing species is phosphorus and the slower diffusing species is arsenic.

14. The method of claim 7 and further providing that the first and second species of ions are of the same conductivity type.

15. The method of claim 1 and further comprising the step of providing that the source and drain regions are asymmetrical.

* * * * *